United States Patent [19]
Noll

[11] Patent Number: 5,243,284
[45] Date of Patent: Sep. 7, 1993

[54] METHOD OF MAGNETIC RESONANCE RECONSTRUCTION IMAGING FROM PROJECTIONS USING PARTIAL DATA COLLECTED IN K-SPACE

[75] Inventor: Douglas C. Noll, Pittsburgh, Pa.

[73] Assignee: Board of Trustees of the Leland Stanford Junior University, Stanford, Calif.

[21] Appl. No.: 736,268

[22] Filed: Jul. 24, 1991

[51] Int. Cl.$^5$ .................................... G01R 33/20
[52] U.S. Cl. .................................... 324/309; 324/307
[58] Field of Search ............... 382/47, 68; 324/300, 324/307, 309, 310, 312

[56] References Cited

U.S. PATENT DOCUMENTS

| | | | |
|---|---|---|---|
| 4,307,343 | 12/1981 | Likes | 324/309 |
| 4,678,996 | 7/1987 | Haacke et al. | 324/322 |
| 4,727,325 | 2/1988 | Matsui et al. | 324/309 |
| 4,748,410 | 5/1988 | Macovski | 324/309 |
| 4,797,616 | 1/1989 | Matsui et al. | 324/309 |
| 4,985,677 | 1/1991 | Pauly | 324/309 |
| 5,025,216 | 6/1991 | Pauly et al. | 324/309 |
| 5,057,776 | 10/1991 | Macovski | 324/322 |
| 5,105,152 | 4/1992 | Pauly | 324/307 |

OTHER PUBLICATIONS

Paul Margosian, et al. "Faster MR Imaging: Imaging with Half the Data," *Health Care Instrumentation*, pp. 195-197, 1986.

Douglas Noll, et al. "Reducing Imaging Time in Short-$T_2$ and Lung Imaging," presented at "Works-in-Progress," 9th Annual Meeting at SMRM, Aug. 18-24, 1990, New York.

Douglas Noll, et al. "Half k-Space Projection Reconstruction Imaging," not presented for publication.

Douglas Noll, et al. "Magnetic resonance reconstruction from projections using half the data," not published as of Jul. 24, 1991.

Donald B. Twieg, "The k-trajectory formulation of the NMR imaging process with applications in analysis and synthesis of imaging methods," Med. Phys. 10(5) Sep.-/Oct. 1983.

James R. MacFall, et al. "Correction of Spatially Dependent Phase Shifts for Partial Fourier Imaging," Magnetic Resonance Imaging, vol. 6, pp. 143-155, 1988.

Douglas Noll, et al. "Homodyne Detection in Magnetic Resonance Imaging," IEEE Trans. on Medical Imaging, vol. 10, 2, Jun. '91.

Jan Cuppen, et al. "Reducing MR Imaging Time By One-Sided Reconstruction," Magnetic Resonance Imaging . vol. 5, No. 6 '87.

John Pauly, et al. "A k-Space Analysis of Small-Tip-Angle Excitation," Journal of Magnetic Resonance 81, 43-56 (1989).

Stig Lunggren, "A Simple Graphical Representation of Fourier-Based Imaging Methods," Jour. of Mag. Res. 54, 338-343 (1983).

*Primary Examiner*—Michael J. Tokar
*Assistant Examiner*—Raymond Y. Mah
*Attorney, Agent, or Firm*—Townsend and Townsend Khourie and Crew

[57] ABSTRACT

The acquisition of radial lines in 2-D Fourier space (k-space) allows the realization of the extremely short echo times useful in the imaging of short-$T_2$ species and flow using Magnetic Resonance (MR). The disadvantage of this imaging method, which is also known as projection reconstruction, is that in order to prevent aliasing at a given resolution, $\pi$ times as many excitations are required as the conventional 2-D Fourier transform or spin-warp acquisition. Disclosed is an acquisition and reconstruction method that reduces the required number of radial lines and excitations by using the properties that projections are real or have slowly varying phase and the at radial acquisition methods are oversampled at the center of k-space. This method preserves resolution while reducing imaging time at the expense of signal-to-noise ratio (SNR). This has been verified with both phantom and human subjects.

12 Claims, 9 Drawing Sheets

METHOD OF MAGNETIC RESONANCE RECONSTRUCTION IMAGING FROM PROJECTIONS USING PARTIAL DATA COLLECTED IN K-SPACE

BACKGROUND OF THE INVENTION

This invention relates generally to magnetic resonance imaging (MRI), and more particularly the invention relates to reduced imaging time in projection reconstruction using magnetic resonance data collected in k-space.

Nuclear magnetic resonance (NMR) imaging, also called magnetic resonance imaging (MRI), is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

A descriptive series of papers on NMR appeared in the June 1980 issue of the IEEE Transactions on Nuclear Science Vol. NS-27, pp. 1220-1225. The basic concepts are described in the lead article, "Introduction to the Principles of NMR," by W. V. House, pp. 1220-1226, which employ computed tomography reconstruction concepts for reconstructing cross-sectional images. A number of two- and three-dimensional imaging methods are described. Medical applications of NMR are discussed by Pykett in "NMR Imaging in Medicine," Scientific American, May 1982, pp. 78-88, and by Mansfield and Morris, NMR Imaging in Biomedicine, Academic Press, 1982.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return to alignment with the static field and give up the energy in the form of weak but detectable free induction decay (FID). These FID signals are used by a computer to produce image.

The excitation frequency, and the FID frequency, is defined by the Larmor relationship which states that the angular frequency, $\omega_0$, of the precession of the nuclei is the product of the magnetic field, $B_0$, and the so-called magnetogyric ratio, $\gamma$, a fundamental physical constant for each nuclear species:

$$\omega_0 = B_0 \cdot \gamma$$

Accordingly, by superimposing a linear gradient field, $B_z = z \cdot G_z$, on the static uniform field, $B_0$, which defines the Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclei spin flip in response to an RF pulse excitation is proportional to the integral of the pulse over time.

Projection reconstruction in MR imaging has become of interest recently for the imaging of short-$T_2$ species, the lung parenchyma, and flow. For the form of projection reconstruction in which data is acquired along radial lines with Free Induction Decay (FID) readouts, no dephasing or phase encoding period is required prior to the data acquisition. The effective echo time can then be very short, as short as 250 μs on a General Electric whole body scanner, which is useful for the above applications because the image can be acquired prior to any substantial $T_2$ decay to signal dephasing due to susceptibility or complex flow. Projection reconstruction sequences have also been found useful for the reduction of motion artifacts and displacement artifact that arises in flow imaging from different phase-encoding and readout times.

U.S. Pat. No. 5,025,216 discloses a method of magnetic resonance imaging of short $T_2$ species using slice-selective excitations based on k-space excitation. While the conventional model of magnetic resonance imaging is based on the correspondence between the spectrum of a transient response (the FID signal) and projections of an unknown spatial distribution, a k-trajectory model views the FID as the spatial-frequency distribution which is the Fourier transform of the unknown spatial distribution to be imaged. See Tweig "The k-trajectory formulation of the NMR imaging process with applications in analysis and synthesis of imaging methods," Medical Physics 10(5) pp. 610-621 September/October 1983. The k-trajectory is the path in spatial-frequency space over which the sampling process occurs, and it is determined by the gradient fields applied during the FID.

The radial line k-space collection strategy is, however, a very inefficient way to cover k space. With the traditional 2-D Fourier transform or spin-warp coverage patterns, a line is typically collected from edge to edge in k space. For the radial line method, data actuation begins at the center k space and proceeds outward, so only ½ of one line in k space is collected with each excitation. This combined with non-constant sampling density in k space causes this inefficiency. Therefore, for a given resolution and field-of-view, the required number of excitations and consequently, the imaging times are increased by a factor of $\pi$ over spin-warp methods.

The present invention is directed to a k-space reconstruction method for projection reconstruction of magnetic response images allowing reduced imaging time.

SUMMARY OF THE INVENTION

Accordingly, an object of the invention is a method of MRI based on projection reconstruction which permits reduced imaging time.

Another object of the invention is a method of magnetic resonance reconstruction from projections using reduced data.

A feature of the invention is the use of k-space trajectories, reduced data sampling, and data interpolation in providing data for projection reconstruction.

In one embodiment, data from every other line in k-space is collected, and unsampled lines are positioned opposite to a sampled line as collinear extension thereof. Data for unsampled lines are later derived for lower frequency line parts by interpolation from collected data in adjacent lines. Higher frequency line parts can be obtained by doubling the known high frequency data in a line after phase adjusting the known and interpolated data. The actual data sampling time is halved by reducing the number of sampled lines by half. The ratio of sampled lines to total lines can be varied with a consequent effect on sampling time and on signal to noise ratio (SNR) of the reconstructed image.

The invention and objects and features thereof will be more readily apparent from the following detailed description and appended claims when taken with the drawing.

DETAILED DESCRIPTION OF ILLUSTRATIVE EMBODIMENTS

Figure 1A:
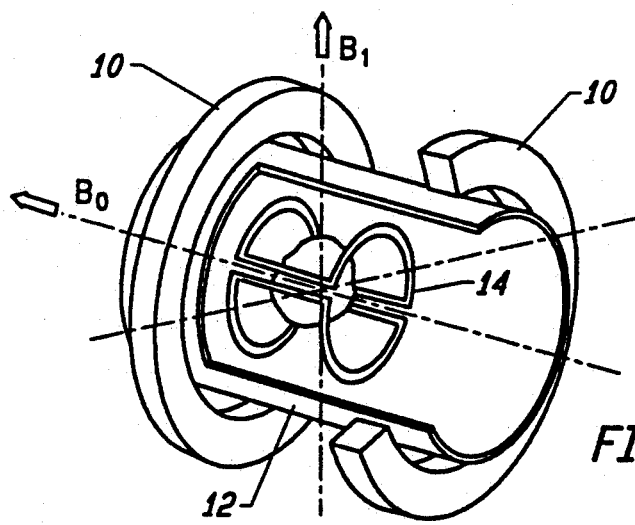
FIGS. 1A–1D illustrate the arrangement of conventional MRI apparatus and magnetic fields generated therein.

Referring now to the drawings, FIG. 1A is a perspective view partially in section illustrating coil apparatus in an NMR imaging system.

Figure 1B:
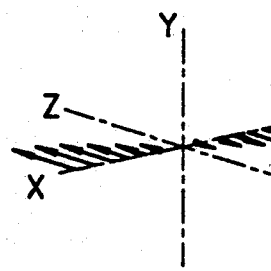
Figure 1C:
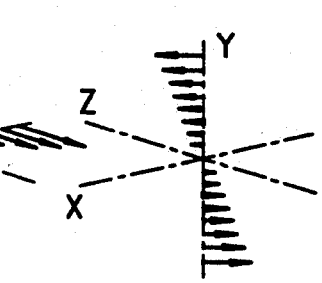
Figure 1D:
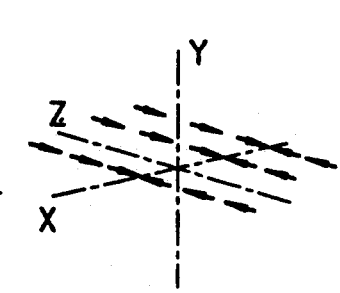

FIGS. 1B–1D illustrate field gradients which can be produced in the apparatus of FIG. 1A. This apparatus is discussed by Hinshaw and Lent, "An Introduction to NMR Imaging: From Bloch Equation to the Imaging Equation," Proceedings of the IEEE. Vol. 71, No. 3, March 1983, pp. 338–350. Briefly, the uniform static field $B_0$ is generated by the magnet comprising the coil pair 10. A gradient field $G_x$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_0$ and varies linearly with distance along the X axis but odes not vary with distance along the Y or Z axes. FIGS. 1C and 1D are similar representations of the Y gradient and Z gradient fields, respectively.

Figure 2:
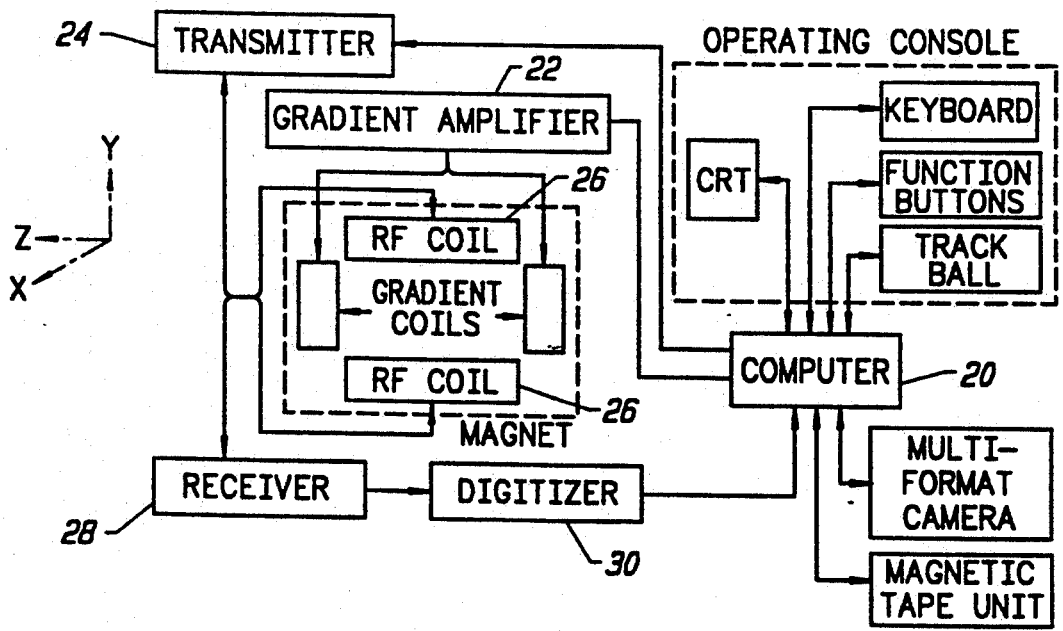
FIG. 2 is a functional block diagram of MRI imaging apparatus.

FIG. 2 is a functional block diagram of the imaging apparatus as disclosed in NMR—A Perspective on Imaging, General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

Figure 3:
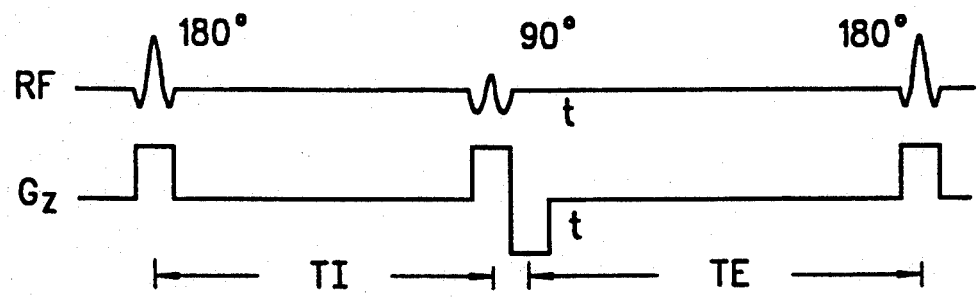
FIG. 3 illustrates a conventional basic pulse sequence for imaging.

FIG. 3 is a graph illustrating applied RF pulses for a 180° flip angle and a 90° flip angle followed by a "time reversal" 180° pulse and the associated Z axis magnetic field gradient applied during application of the RF pulses. The illustrated pulses are conventional sinc pulses which have front and back lobes with a main RF pulse therebetween.

As noted above, projection reconstruction in magnetic resonance imaging has recently become of interest for imaging short-$T_2$ species, the lung parenchyma, and blood flow. Projection reconstruction is widely used in CT tomography, but in MRI two dimensional Fourier transform (2DFT) techniques using gradients for uniquely identifying pixel FID signals by phase and frequency have been more widely used. However, projection reconstruction in MRI was proposed as early as 1973 by Lauterbur in *Nature* 242, 190 (1973). In projection reconstruction, a constant gradient is applied in the direction $\theta$ of the projection. In k-space, the k-trajectory is simply the path in spatial-frequency space over which the sampling process occurs, as determined by the gradient applied in the direction $\theta$ during the free induction decay (FID). A set or k-space trajectories into projections of the object to be imaged.

Figure 4A:
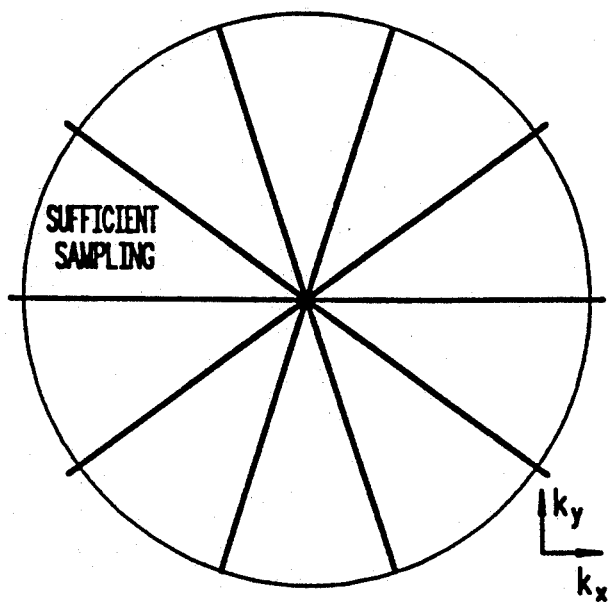
FIGS. 4A and 4B illustrate projection reconstruction k-space with sufficient angular sampling density and without sufficient sampling density, respectively.
Figure 4B:
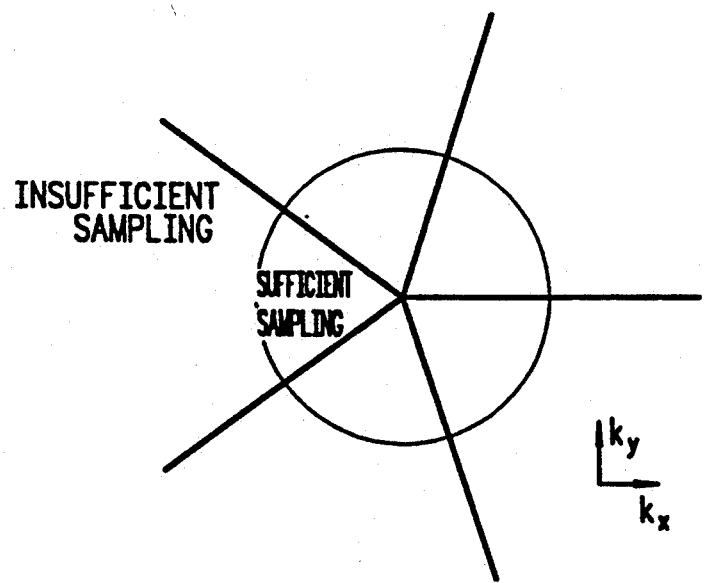

A property of projection reconstruction k-space trajectories is that the sample density varies inversely with the distance from the center of the k-space. Consequently, if the radial lines in k-space have uniform angular spacing, there will always be a region at the center of k-space that will have sufficient sampling density. For example, if the angular sampling density is half of the required density, those spatial frequencies less than one-half of the maximum will still be sufficiently sampled, as shown in FIG. 4. Reconstruction from fewer than the required number of radial lines results in a streaking artifact for filtered backprojection reconstructions or a rotational blur in the outer part of the image for Fourier interpolation reconstructions. An unaliased lower resolution image can be reconstructed from the region of sufficient sampling, which implies that any k-space point in that region can be determined by interpolation provided that the object does not extend beyond the field-of-view.

In accordance with the present invention, reduced sampling of k-space trajectories is employed to reduce the data acquisition time. Data interpolation and data doubling can then be used with the sampled data to provide data for all k-space trajectories used in the projection reconstruction of an image.

Figure 5:
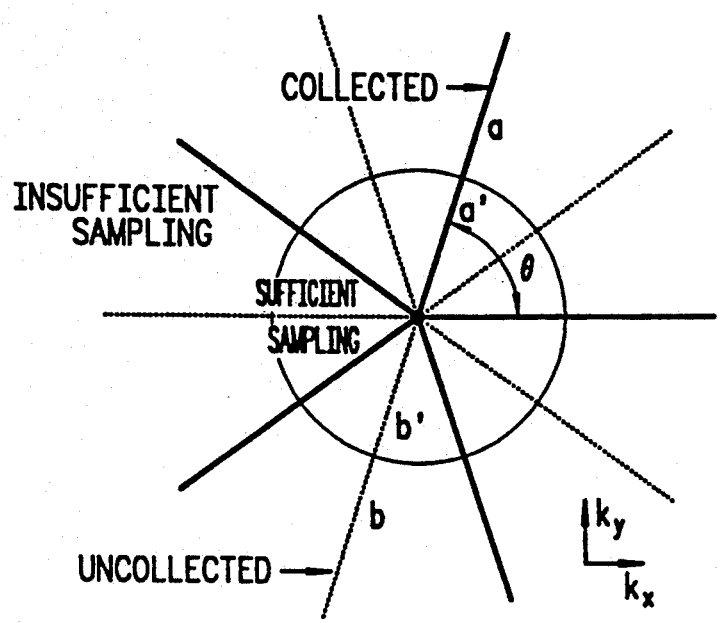
FIG. 5 illustrates half k-space data collection for projection reconstruction in accordance with one embodiment of the invention.

In one embodiment of the reconstruction method, only every other radial line in k space is collected and all uncollected lines are positioned "opposite" to a line which has been collected as a collinear extension thereof, as demonstrated in FIG. 5. One way in which this can be achieved is to collect an odd number of evenly spaced radial lines. More specifically, consider the line through k-space that corresponds to the segments (a,a',b',b) in FIG. 5. If one collects the segment denoted by (a,a'), then the segment denoted by (b,b') is not collected. Because k space is sufficiently sampled inside of the circle, the segment b' can be approximately determined by interpolation. The interpolation method used here includes only the two dominant terms, which is equivalent to the crude average of the neighboring radial lines. Since a and a' were collected directly, this now only leaves segment b to be determined.

Figure 6:
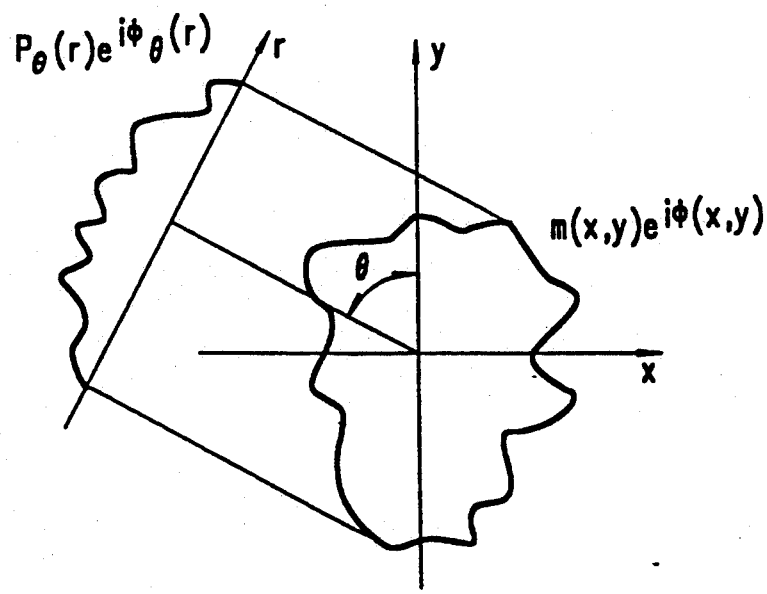
FIG. 6 illustrates the projection of an object as used in projection reconstruction.

By the central section theorem, a line passing through the center of k space corresponds to the 1-D Fourier Transform (FT) of the projection of the object taken at the same angle. That is, the full line in k space at an angle $\theta$ (a,a',b',b) can be represented as follows:

$$F_{1-D}[p_\theta(r)e^{i\phi(r)}] \quad (1)$$

for the projection as defined in FIG. 6. One therefore knows $\tilde{l}$ (a,a',b') of the Fourier transform of the projection at angle $\theta$.

Each projection, $p_\theta(r)$, will now be reconstructed from the known $\tilde{l}$ of the FT of that projection by applying in 1-D, any partial k-space reconstruction technique, such as homodyne detection. See Noll and Nishimura, "Homodyne Detection in Magnetic Resonance Imaging," IEEE Transactions on Medical Imaging, Vol. 10, No. 2, June 1991. In homodyne detection, it is assumed that the object phase is slowly varying and therefore, the object phase can be approximated by the phase of a low resolution or low-pass filtered image. For this application, the "object" being reconstructed is each projection, so one can assume that the projection has slowly varying phase. Given an object, $m(x,y)e^{i\phi(x,y)}$, and a projection, $p_\theta(r)e^{i\phi_\theta(r)}$, one can assume that the projection phase, $\phi_\theta(r)$, will be slowly varying if (1) the object phase, $\phi(x,y)$, is slowly varying and (2) $m(x,y)$ is not sparse.

If the full line through k-space (a,a',b',b) is decomposed into low and high frequency parts, then the projection can be represented as:

$$p_\theta(r)e^{i\phi_\theta(r)} = p_l(r)e^{i\phi_l(r)} + p_h(r)e^{i\phi_h(r)} \quad (2)$$

where $p_l(r)e^{i\phi_l(r)}$ and $p_h(r)e^{i\phi_h(r)}$ are defined as the inverse FT of (a',b') and (a,b), respectively. Under the above assumption of slowly varying phase, $\phi_\theta(r) = \phi_l(r)$ and consequently, $\phi_h(r) = \phi_\theta(r) = \phi_l(r)$. In homodyne detection for partial k-space reconstruction, the low frequency image is reconstructed for use as a phase reference $\phi_l(r)$. An image is then reconstructed using all available data in which the known high frequency information is doubled to account for the unknown data:

$$F_{1-D}^{-1}[(a', b')] + 2F_{1-D}^{-1}[(a)] = p_l(r)e^{i\phi_l(r)} + p_h(r)e^{i\phi_h(r)} + \quad (3)$$

$$\left(\frac{i}{\pi r} * p_h(r)e^{i\phi_h(r)}\right) \approx \left[p_\theta(r) + i\left(\frac{1}{\pi r} * p_h(r)\right)\right]e^{i\phi_\theta(r)}$$

under the assumption that $\phi_h(r) = \phi_\theta(r) = \phi_l(r)$. Since this phase was determined from the phase reference, the undesired component, $(1/\pi r)*p_h(r)$ is easily removed, and the desired projection, $p_\theta(r)e^{i\phi_\theta(r)}$ can be determined.

Once all projections have been found, the object can then be reconstructed by filtering each projection and using backprojection. See for example Herman, "Image Reconstruction from Projections," New York: Academic Press, 1980. Because homodyne detection is linear, the filter can actually be applied by weighting the k-space data with the appropriate filter prior to the reconstruction of each projection. The method of image reconstruction used here will be to 1-D Fourier transform all projections to the k-space domain and interpolate to a rectilinear grid. Since the transformed data are all processed and some inconsistencies may exist due to violation of the slowly varying phase assumption, the original data will be substituted where it is available. Additionally, in order to avoid artifacts from the transition from processed data to original data, there will be a gradual (linear) transition from interpolated data to processed data in the region of sufficient sampling. So, for the sample line through k-space (a,a',b',b) from FIG. 5, segments a and a' are collected and used directly, segment b' is a combination of interpolated and processed data, and segment b is completely processed data. This data is then interpolated to a rectilinear grid in k-space, and the final image is then the 2-D FT of this k-space data.

The SNR of an MR image is well known to have the following relationship[r]:

$$SNR \alpha V\sqrt{T} \quad (4)$$

where V is the voxel volume (the volume corresponding to each pixel and T is the total acquisition time. In this method, the acquisition time is halved while the resolution remains unchanged, therefore the SNR falls by $\sqrt{2}$ approximately 3 dB. A more detailed analysis of SNR can be performed for the filtered backprojection case. For the reconstruction using full data, assume that each of N independent filtered projections has noise variance $\sigma^2$, then each reconstructed image point will have variance $N\sigma^2$. For the half data reconstruction, it can be shown that each reconstructed and filtered projection will have variance $(59/32)\sigma^2$ and is correlated with neighboring projections by $\sigma^2/16$. Each image point will then have variance $(63/32)N\sigma^2$. This slight difference can be traced to the crude interpolation step in the reconstruction of the projections, which causes the overall reconstruction to be slightly spatially variant.

A practice common when using projection reconstruction in MR is to collect fewer than the required number of radial lines and accept the radial blur that arises from angular undersampling and Fourier interpolation reconstructions. For example, if 512 radial lines are collected and the target image is 256×256, then the angular sampling density is sufficient to completely resolve and area of diameter 163 (512/$\pi$) at the center of the image, outside of which there is a radial blur that increases from the central part to the edge of the image. If one applies the described method with approximately the same number of radial lines, this radial blur could be completely removed with no cost to imaging time or SNR. For example, if one collects 511 radial lines and use the half data method, the 256×256 image can be reconstructed with angular sampling equivalent to 1022 radial lines, thus eliminating the rotational blur. Since the resolution and imaging time are virtually the same, the SNR is unchanged and only the blur has been removed.

Figure 7A:
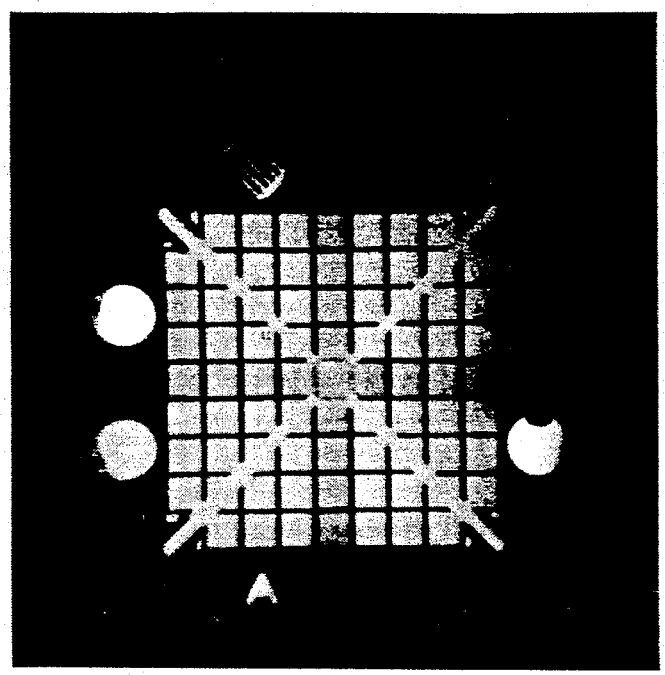
FIGS. 7A–7C are projection-reconstruction phantom images using 512 radial lines in k-space, projection reconstruction image using 256 radial lines, and a difference image of FIGS. 7A and 7B showing radial blur resulting from angular undersampling.
Figure 7B:
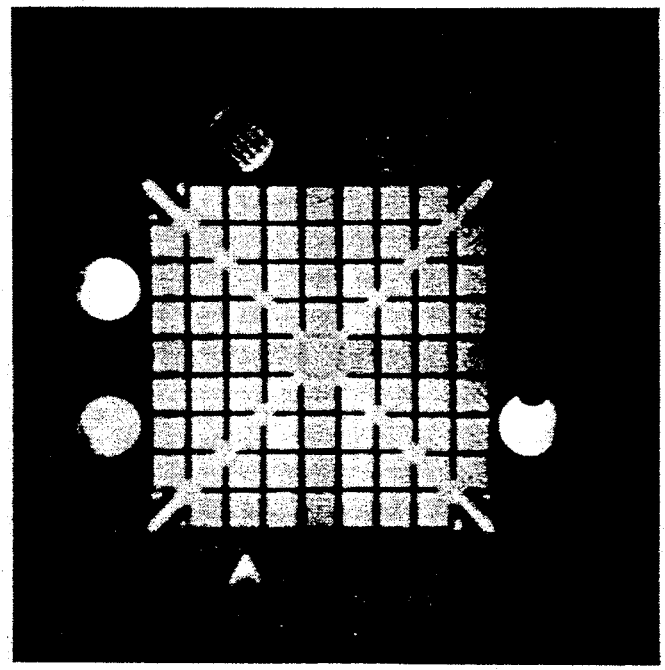
Figure 7C:
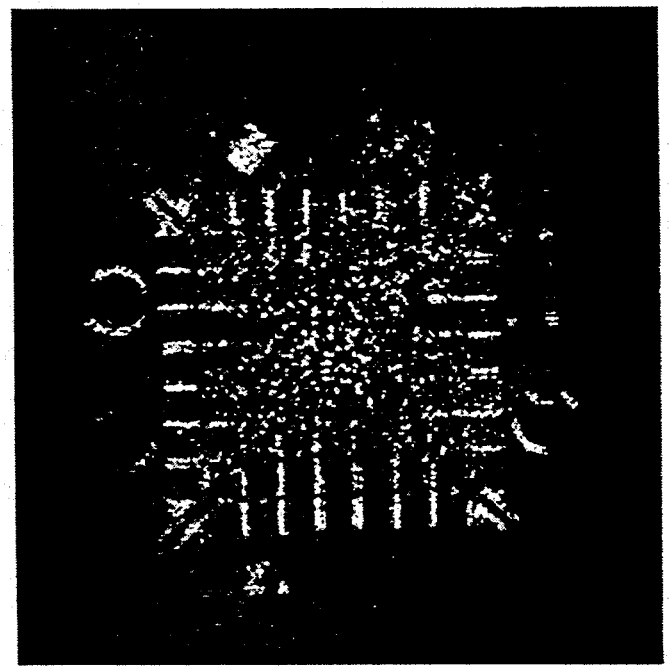
Figure 8A:
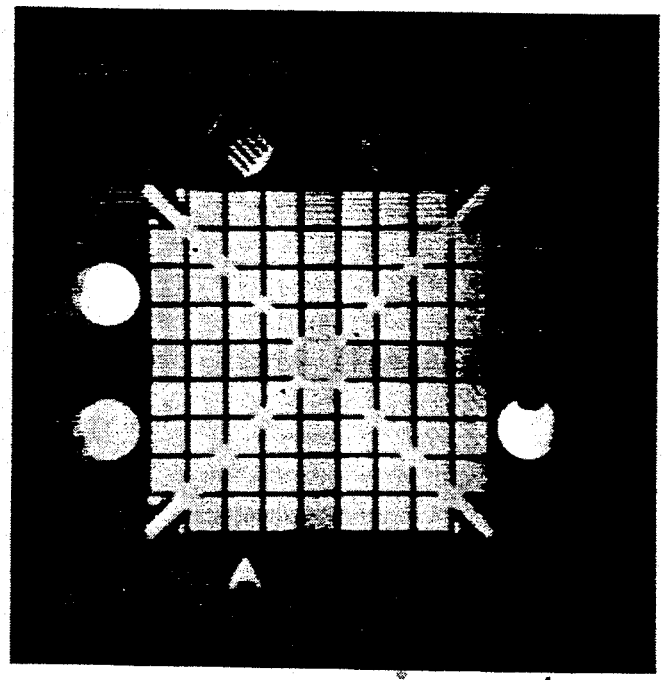
FIGS. 8A and 8B are a projection reconstruction images of the phantom using 257 radial lines in accordance with the invention and a difference image of FIGS. 7A and 8A showing primarily noise.
Figure 8B:
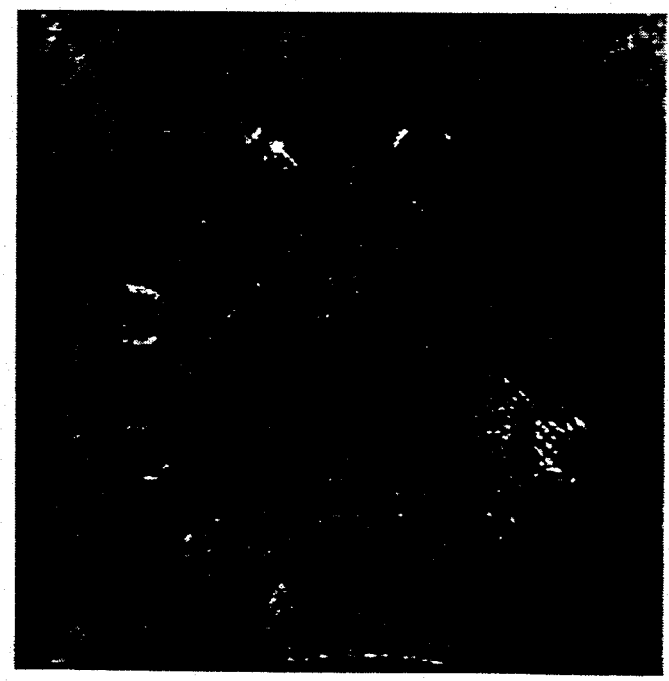

The half-data projection reconstruction method was experimentally verified using a GE Signal 1.5T system with standard gradient amplifiers, shielded gradients and a 50 kHz bandwidth sampling filter. The acquired data was reconstructed using bi-linear interpolation to a rectilinear grid in k-space and using a 2-D Fast Fourier Transform (FFT). All images had effective echo times of 250 $\mu$s and effective readout lengths of 1.52-1.83 ms. For the phantom study, an image using all 512 radial lines was reconstructed normally and is found in FIG. 7A. The radial blur from angular undersampling is demonstrated in FIG. 7B in an image reconstructed from only 256 radial lines. The images of FIG. 8 were reconstructed from 257 radial lines using the half-data projection reconstruction method. These images demonstrate two points: (1) imaging time was halved at the expense of SNR by using the half-data projection reconstruction method when compared to FIG. 7A, and (2) radial blur was removed at no cost to SNR when compared to FIG. 7B.

Figure 9A:
FIGS. 9A and 9B are projection reconstruction images of a head using 512 radial lines and 257 radial lines, respectively.
Figure 9B:
Figure 10A:
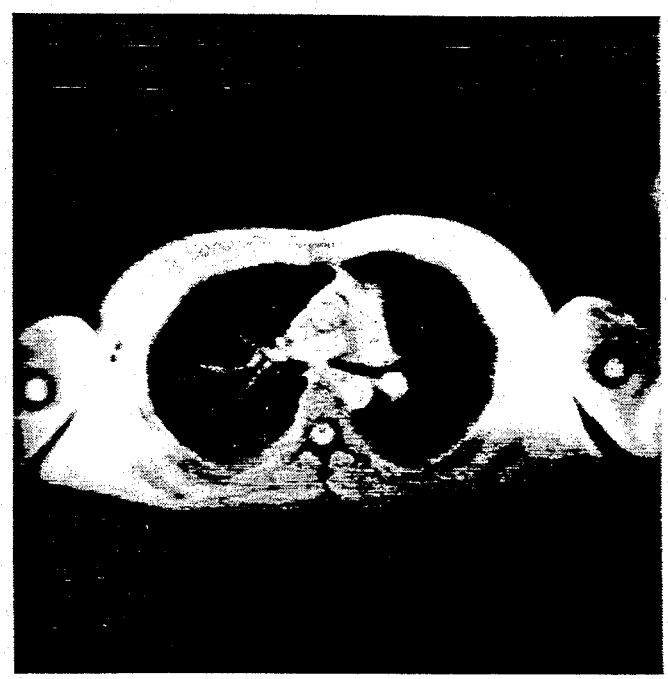
FIGS. 10A and 10B are projection-reconstruction images of lungs using 512 radial lines and 257 radial lines, respectively.
Figure 10B:
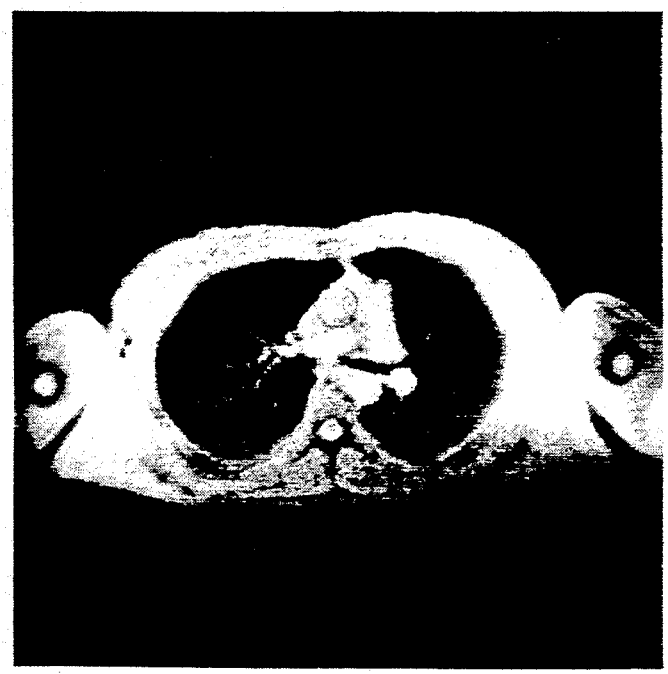

This reconstruction method has also been applied to images of human volunteers. Projection reconstruction images of head and the lungs are found in FIGS. 9 and 10, respectively, using both the normal and half-data reconstructions. This images verify in vivo that projection reconstruction imaging time can be halved only at the expense of SNR.

There has been described a projection imaging method in which the acquisition of radial lines in k-space using FID readouts enables extremely short echo times that are useful for the imaging of short $T_2$ species, lungs, and flow. Imaging time can be halved by using the above described half k-space acquisition and reconstruction method, but the SNR is reduced by 3 dB($1/\sqrt{2}$). This technique relies on the properties that (1) projections are real or have slowly varying phase and (2) radial-line acquisition methods are oversampled at the center of k-space. Each projection is reconstructed using any partial k-space technique in 1-D after which the entire image is reconstructed. This technique could also be used to extend the region free of radial blur when using Fourier interpolation techniques at no expense to SNR. This technique was experimentally verified on phantom and in vivo objects.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. In magnetic resonance imaging of one object based on projection reconstruction, a method of obtaining data for k-space trajectories comprising the steps of
   a) establishing a set of radial k-space trajectories all originating at the center k-space for use in projection reconstruction of an image of said object, each trajectory having a low frequency part and a high frequency part,
   b) sequentially exciting said object and detecting data samples along less than all of said set of radial k-space trajectories, and
   c) obtaining data samples for low frequency parts of unsampled trajectories based on interpolation of detected data samples of low frequency parts of adjacent sampled trajectories.

2. The method as defined by claim 1 wherein all unsampled trajectories are opposite to and collinear extensions of sampled trajectories, and further including
   d) obtaining data samples for high frequency parts of unsampled trajectories based on the sampled high frequency parts of linearly extending sampled trajectories.

3. The method as defined by claim 2 wherein step d) includes establishing a phase reference for said data samples for high frequency parts, said phase reference being for use in determining high frequency parts of unsampled trajectories based on a reconstructed low frequency projection.

4. The method as defined by claim 3 and further including doubling said sampled high frequency parts.

5. The method as defined by claim 3 wherein a sampled trajectory has a low frequency part, a', and a high frequency parts, a; a collinear unsampled trajectory has a low frequency a part, b'; and a high frequency part, b; and a projection of the line (a,a',b,b') is defined as $$p_\theta(r)e^{i\phi\theta(r)} = p_l(r)e^{i\phi_l(r)} + p_h(r)e^{i\phi_h(r)}$$

where $p_l(r)e^{i\phi_l(r)}$ and $p_h(r)e^{i\phi_h(r)}$ are defined as the inverse Fourier Transform of (a',b') and (a,b), respectively, and $p_\theta(r)$ = projection magnitude
$\phi_\theta(r)$ = projection phase
$p_l(r)$ = projection magnitude low frequency parts
$\phi_l(r)$ = projection low frequency phase
$p_h(r)$ = projection magnitude high frequency parts
$\phi_h(r)$ = projection high frequency phase.

6. The method as defined by claim 5 wherein $$F_{1-D}^{-1}[(a', b')] + 2F_{1-D}^{-1}[(a)] = p_l(r)e^{i\phi_l(r)} + p_h(r)e^{i\phi_h(r)} + \left(\frac{i}{\pi r} * p_h(r)e^{i\phi_h(r)}\right) \approx \left[p_\theta(r) + i\left(\frac{1}{\pi r} * p_h(r)\right)\right]e^{i\phi_\theta(r)}$$

where $\phi_l(r)$ is a phase reference based on a low frequency image, and assuming that $\phi_h(r) = \phi_\theta(r) = \phi_l(r)$, and $F_1^{-1}{}_D$ = sampled and interpolated low frequency parts,
$F_1^{-1}{}_D$ = sampled high frequency parts.

7. The method as defined by claim 6 wherein the projection for a k-space trajectory is based on the in-phase portion, $p_\theta(r)e^{i\phi_\theta(r)}$.

8. A method of magnetic resonance imaging using projection reconstruction comprising the steps of
   a) obtaining data samples for a first plurality of radial k-space trajectories all originating at the center of k-space, each trajectory having a low frequency part and a high frequency part,
   b) obtaining data for a second plurality of radial k-space trajectories having low frequency parts and high frequency parts each of said second plurality of trajectories being opposite to and collinear extensions of one of said first plurality of trajectories, including interpolating low frequency parts from adjacent sampled trajectories,
   c) Fourier transforming collinear trajectories of said first plurality of trajectories and said second plurality of trajectories to obtain projections, and
   d) reconstructing an image based on said projections.

9. The method as defined by claim 8 wherein a sampled trajectory has a low frequency parts, a', and a high frequency part, a; a collinear unsampled trajectory has a low frequency apart, b', and a high frequency part, b; and a projection of the line (a,a',b',b) is defined as $$p_\theta(r)e^{i\phi\theta(r)} = p_l(r)e^{i\phi l(r)} + p_h(r)e^{i\phi h(r)}$$

where $p_l(r)e^{i\phi l(r)}$ and $p_h(r)e^{i\phi h(r)}$ are defined as the inverse Fourier Transform of (a',b') and (a,b), respectively, and $p_\theta(r)$ = projection magnitude
$\phi_\theta(r)$ = projection phase
$p_l(r)$ = projection magnitude low frequency parts
$\phi_l(r)$ = projection low frequency phase
$p_h(r)$ = projection magnitude high frequency parts
$\phi_h(r)$ = projection high frequency phase.

10. The method as defined by claim 9 and further including doubling said sampled high frequency parts, a, in obtaining high frequency unsampled parts, b.

11. The method as defined by claim 10 wherein $$F_{1D}^{-1}[(a', b')] + 2F_{1D}^{-1}[(a)] = p_l(r)e^{i\phi l(r)} + p_h(r)e^{i\phi h(r)} + \left(\frac{i}{\pi r} * p_h(r)e^{i\phi h(r)}\right) \approx \left[p_\theta(r) + i\left(\frac{1}{\pi r} * p_h(r)\right)\right]e^{i\phi\theta(r)}$$

wherein $\phi_l(r)$ is a phase reference based on a low frequency image, and assuming that $\phi_h(r) = \phi_\theta(r) = \phi_l(r)$, and $F_1^{-1}{}_D$ = sampled and interpolated low frequency parts,
$R_1^{-1}{}_D$ = sampled high frequency parts.

12. The method as defined by claim 11 wherein the projection for a k-space trajectory is based on the in-phase portion, $p_\theta(r)e^{i\phi\theta(r)}$.

* * * * *

UNITED STATES PATENT AND TRADEMARK OFFICE
CERTIFICATE OF CORRECTION

PATENT NO. : 5,243,284

DATED : September 7, 1993

INVENTOR(S) : DOUGLAS C. NOLL

It is certified that error appears in the above-identified patent and that said Letters Patent is hereby corrected as shown below:

On the title page, insert the following paragraph:

--This invention was made with Government support under contract HL39297 awarded by the National Institutes of Health. The Government has certain rights in this invention.--

Signed and Sealed this

Fourth Day of July, 1995

Attest:

BRUCE LEHMAN

Attesting Officer    Commissioner of Patents and Trademarks